(12) United States Patent
Ehrlich

(10) Patent No.: US 11,132,854 B2
(45) Date of Patent: Sep. 28, 2021

(54) INCONSPICUOUS ACCESS CONTROL DEVICE

(71) Applicant: Sensormatic Electronics, LLC, Boca Raton, FL (US)

(72) Inventor: Alexis Brooke Ehrlich, Boca Raton, FL (US)

(73) Assignee: SENSORMATIC ELECTRONICS, LLC, Boca Raton, FL (US)

(*) Notice: Subject to any disclaimer, the term of this patent is extended or adjusted under 35 U.S.C. 154(b) by 66 days.

(21) Appl. No.: 16/664,450

(22) Filed: Oct. 25, 2019

(65) Prior Publication Data

US 2021/0125438 A1  Apr. 29, 2021

(51) Int. Cl.
| | | |
|---|---|---|
| *G07C 9/00* | (2020.01) | |
| *G06F 3/02* | (2006.01) | |
| *G08B 6/00* | (2006.01) | |
| *G08B 5/22* | (2006.01) | |
| *G08B 3/10* | (2006.01) | |

(52) U.S. Cl.
CPC ....... *G07C 9/00571* (2013.01); *G06F 3/0202* (2013.01); *G07C 9/00714* (2013.01); *G08B 3/10* (2013.01); *G08B 5/22* (2013.01); *G08B 6/00* (2013.01)

(58) Field of Classification Search
CPC ... G08B 3/10; G08B 5/22; G08B 6/00; G07C 9/00571; G07C 9/00714; G06F 3/0202
USPC ....................................................... 340/5.51
See application file for complete search history.

(56) References Cited

U.S. PATENT DOCUMENTS

| | | | | |
|---|---|---|---|---|
| 5,252,960 A | * | 10/1993 | Duhame | G07C 9/00182 340/5.64 |
| 5,389,919 A | * | 2/1995 | Warren | E05B 65/462 109/7 |
| 5,841,361 A | * | 11/1998 | Hoffman | E05B 47/00 340/5.54 |
| 6,031,465 A | * | 2/2000 | Burgess | G07C 9/00182 340/426.36 |
| 6,049,790 A | * | 4/2000 | Rhelimi | G06F 3/021 341/22 |
| 6,359,547 B1 | * | 3/2002 | Denison | G07C 9/00912 340/5.73 |
| 6,549,194 B1 | * | 4/2003 | McIntyre | G06F 21/6218 345/173 |
| 7,106,171 B1 | * | 9/2006 | Burgess | B60R 25/23 340/10.42 |

(Continued)

*Primary Examiner* — Nam V Nguyen
(74) *Attorney, Agent, or Firm* — Arent Fox LLP

(57) ABSTRACT

An access control device including a keypad member and an communication module. The keypad member may include a substrate layer having a mounting surface and an internal surface, and a capacitive sensing layer mounted on the internal surface of the substrate layer and including a keypad circuit having a plurality of capacitive sensors defining a plurality of keys. They keypad circuit may include a clear conductive ink. The keypad member may further include a user interface layer mounted on the capacitive sensing layer. The access control device may be configured to be in communication with the capacitive sensing layer and have a mounting structure positioned at a spacing distance from the mounting surface of the substrate layer and a communication link electrically connecting the communication module and the capacitive sensing layer.

23 Claims, 5 Drawing Sheets

(56) References Cited

U.S. PATENT DOCUMENTS

| | | | | |
|---|---|---|---|---|
| 7,230,610 B2 * | 6/2007 | Jung | .................... | D03D 15/593 |
| | | | | 345/173 |
| 7,839,881 B2 * | 11/2010 | Lee | ........................ | H04M 1/05 |
| | | | | 370/430 |
| 7,869,589 B2 * | 1/2011 | Tuovinen | ............... | G10K 9/122 |
| | | | | 379/433.07 |
| 8,564,566 B2 * | 10/2013 | Wu | ........................ | G06F 3/021 |
| | | | | 345/174 |
| 8,836,647 B2 * | 9/2014 | Alexander | .......... | G06F 3/04164 |
| | | | | 345/173 |
| 9,229,597 B2 * | 1/2016 | Oraw | .................... | G06F 3/0443 |
| 9,286,741 B2 * | 3/2016 | Adolfsson | ............. | H04W 12/08 |
| 9,396,598 B2 * | 7/2016 | Daniel-Wayman | ...... | G07C 9/23 |
| 9,443,362 B2 * | 9/2016 | Singh | ........................ | G07C 9/28 |
| 9,934,636 B1 * | 4/2018 | Burge | ................. | G07C 9/00904 |
| 2011/0018832 A1 * | 1/2011 | Pryor | ................. | G06F 3/04847 |
| | | | | 345/173 |
| 2011/0210818 A1 * | 9/2011 | Denison | ................ | G07F 7/1008 |
| | | | | 340/5.6 |
| 2013/0126325 A1 * | 5/2013 | Curtis | ................ | H03K 17/9622 |
| | | | | 200/5 A |
| 2016/0313822 A1 * | 10/2016 | Krishnakumar | .... | G06F 3/04186 |
| 2018/0217698 A1 * | 8/2018 | Jung | .................... | G06K 9/0002 |
| 2019/0278951 A1 * | 9/2019 | Hershman | ............ | H05K 9/0071 |

\* cited by examiner

INCONSPICUOUS ACCESS CONTROL DEVICE

TECHNICAL FIELD

The described aspects relate to access control systems, and more particularly to an access control reader.

BACKGROUND

Access control systems are used in the fields of physical and information security, and are implemented to selectively restrict access of people or other entities to a physical location or other resources, and can vary as widely as human guards, turnstiles, mechanical lock-and-key systems. Recently, however, electronic access control systems have been widely implemented due to a plurality of advantages, such as the ability to keep records of access attempts. Typically, such access control systems include an access control device, such as an access control reader, that receives an input for determining whether or not to allow a user to enter a secured space. For example, the input may include a password, personal identification number, or biometric measurement. Because of the relative technical complexity of electronic access control systems, bulky hardware components are necessary to accurately grant or deny access to authorized entities. Consequently typical access control devices are bulky and visibly different from the surrounding environment.

In some instances, where the presence of security and other access control features is well known and otherwise advertised, bulky access control devices serve as, at best, a visual reminder of the installed security features and, at worst, an inconvenient eyesore. However, in instances where the entities restricting access to a specific location or resource need to be discrete regarding the existence of such a restricted space, bulky access control devices that differ visibly from the surrounding environment may enhance security risks posed to authorized personal or otherwise. Consequently, improvements in access control devices are desired.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

An example implementation includes an access control device, including a keypad member. The keypad member may include a substrate layer having a mounting surface and an internal surface, and a capacitive sensing layer mounted on the internal surface of the substrate layer and including a keypad circuit having a plurality of capacitive sensors defining a plurality of keys. They keypad circuit may comprise a clear conductive ink. The keypad member may further include a user interface layer mounted on the capacitive sensing layer. The access control device may further include a communication module in communication with the capacitive sensing layer and having a mounting structure positioned at a spacing distance from the mounting surface of the substrate layer and a communication link electrically connecting the communication module and the capacitive sensing layer.

An example implementation may include an access control system. They access control system may include a keypad member with a substrate layer having a mounting surface and an internal surface, a capacitive sensing layer mounted on the internal surface of the substrate layer and including a keypad circuit having a plurality of capacitive sensors defining a plurality of keys, wherein the keypad circuit comprises a clear conductive ink. The keypad member may further include a user interface layer mounted on the capacitive sensing layer, wherein the user interface layer comprises a material that is at least translucent. They access control system may additionally include a first communication module in communication with the capacitive sensing layer and having a mounting structure positioned at a spacing distance from the mounting surface of the substrate layer, and a first communication link electrically connecting the first communication module and the capacitive sensing layer. The system may include a lock member movable between a locked position and an unlocked position and a lock access controller in communication with the lock member and the communication module. The movement of the lock member may be controlled by an access determination message generated by an access control manager server. The access control manager sever may include a memory and a processor configured to generate an access determination message in response to one or more of the plurality of access sensors receiving a user access code input.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Aspects of the present disclosure relate to an access control device operable in an access control system. The access control device, such as an access control reader, may include a keypad member formed from a plurality of thin material layers and located in communication with but away from a communications module, a controller, and/or other bulky associated hardware. The configuration of the keypad member may allow the keypad member to form an unobtrusive, inconspicuous part of the environment, which thereby improves the aesthetics of the environment in which the keypad member and access control system is installed, and enhancing the safety of authorized personnel.

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

Figure 1:
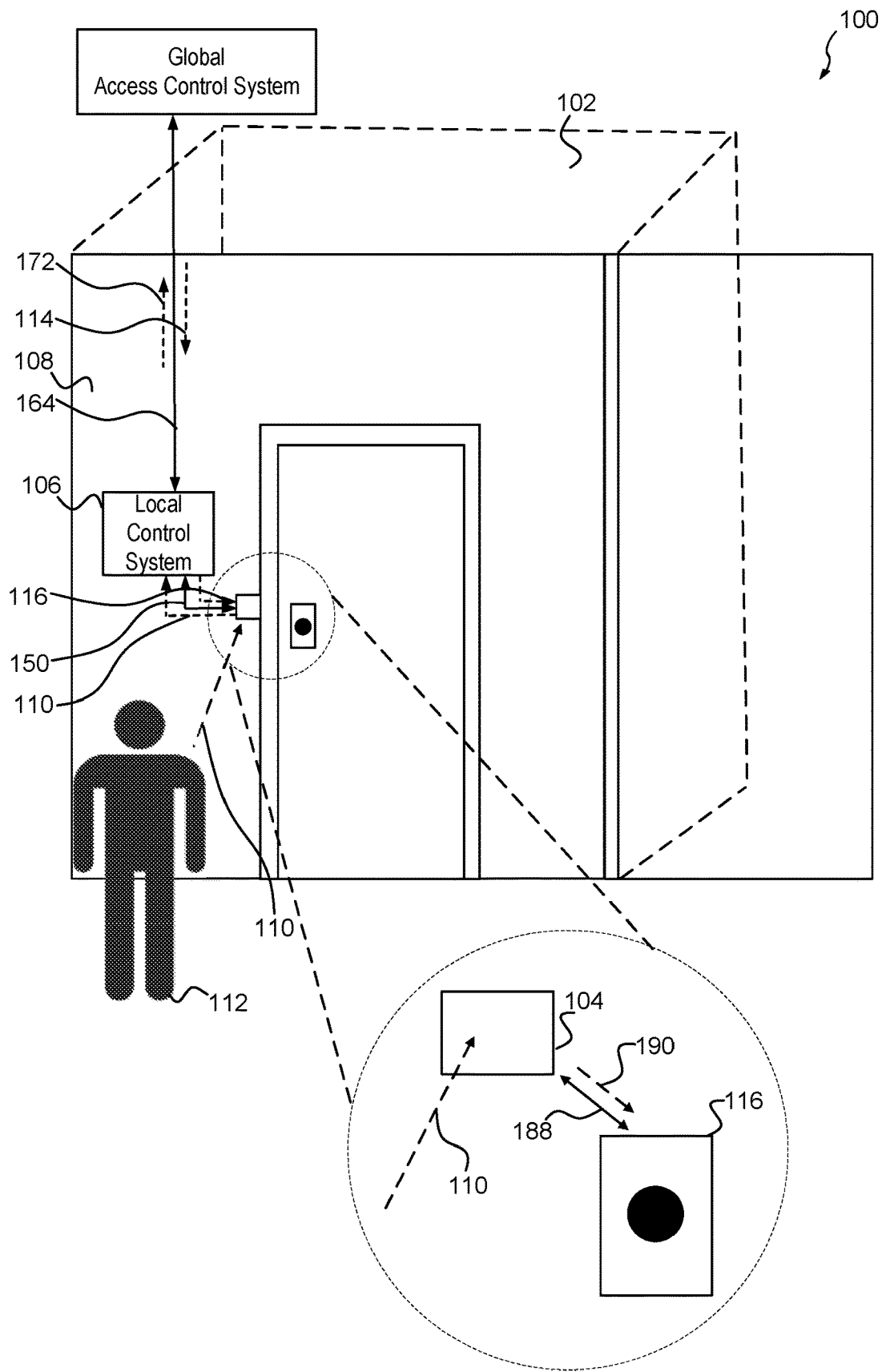
FIG. 1 is a schematic diagram of an example of an inconspicuous access control system, according to the described aspects of the present disclosure.

Referring to FIG. 1, an example inconspicuous access control system 100 controls access to a designated restricted location 102 to an authorized entity(s) through use of an inconspicuous keypad member 104 that receives inputs to control opening or locking of a controllable lock member 116. For example, keypad member 104 may be considered inconspicuous as a result of both its location at a spacing distance from local control system 106, wherein the communication module is out of view of keypad member 104, and its visually discrete materiality relative to the mounting surface. Additionally, keypad member 104 may be a relatively thin or flat panel having a plurality of different, visible key symbols (e.g., numeric, alphanumeric, and/or other symbols), which may be actuated by an entity 112, such as a person attempting to access restricted location 102. For instance, the key symbols on keypad member 104 may be visible to entity 112, such as but not limited to being printed on the outer surface, raised members on the outer surface, or internally-lighted areas or symbols, as will be explained in more detail below. Also, for example, lock member 116 may include any type of locking mechanism, such as a bolt, a contact plate, etc., configured to move between a locked position and an unlocked position, thereby controlling a door or other access-restricting member and allowing or denying access to the restricted location 102. In an aspect, keypad member 104 may be capable of receiving a user input 110 from entity 112, wherein user input 110 includes information, such as an access code and/or personal identification information, which identifies entity 112 as authorized to enter restricted location 102. For example, user input 110 may be indicated by entity 112 actuating one or more, e.g., a series, of the plurality of different, visible input areas of keypad member 104. Further, keypad member 104 may transmit user input 110 to a local control system 106 via a communication link 150, wherein, in one example communication link 150 may include one or more wires having a length that spans the spacing distance. Furthermore, local control system 106 may transmit an access request 172 based on the user input 110 to global control system 108 via communication link 164. Global control system 108 may then process access request 172, verifying the authorization of entity 112 for access to restricted location 102 based on user input 110. Global access control system 108 may then respond to authorization request 172 by transmitting an access determination message 114 back to local control system 106 via communication link 164. Access determination message 114 may include an access indicator, such as a bit or other set of information, including an access authorized value or an access denied value. Local control system 106 is then capable of transmitting a lock control signal 190 to lock member 116 via communication links 150 and 188. Lock control signal 190 may include, for example, an unlock command configured to move lock member 116 to an unlocked position, granting entity 112 access to restricted space 102, for example, if user input 110 was authenticated by global access system 108. Alternatively, lock control signal 190 may include, for example, a lock command configured to move or maintain lock member 116 in a locked position, preventing entity 112 from having access to restricted space 102, for example, if user input 110 was not authenticated by global access system 108.

While FIG. 1 includes one possible arrangement of keypad member 104, local control system 106, and lock member 116, it is important to note that this example is not intended to be restrictive. In one example, keypad member 104 may be mounted in a first environment located at the spacing distance from a second environment in which local control system 106 is mountable, wherein local control system 106 is out of view of keypad member 104. Keypad member 104 may be mounted on a door or other comparable access control mechanism, or may be secured to an adjacent wall or other surface in the general vicinity of the door or other access control mechanism. For example, the keypad member 104 may be secured on or in the vicinity of a door jamb or within a reasonable distance from a door or other access control mechanism. Likewise, local control system 106 may be located discretely within a wall in the general vicinity of door or other access control mechanism to which the access control system 100 is applied. However, local control system 106 may be incorporated in other inconspicuous locations in the general vicinity the same general vicinity, such as in within a door frame, a door hinge of the door, or any other space to which the access control system 100 is applied and/or that may be inconspicuous to a view of entity 112.

Figure 2:
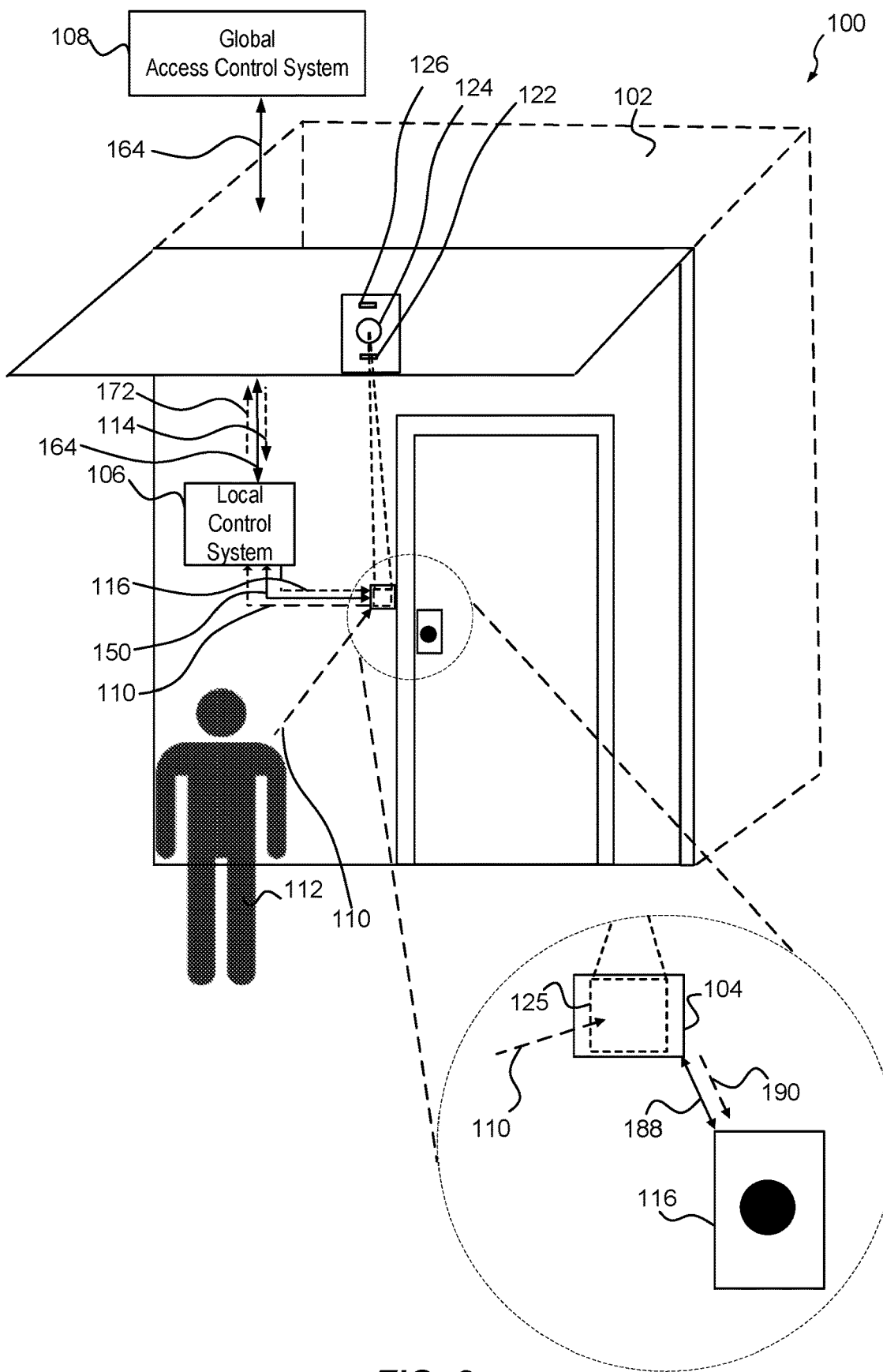
FIG. 2 is a schematic diagram of another example of an inconspicuous access control system, according to the described aspects of the present disclosure.

Referring to FIG. 2, another example of inconspicuous access control system 100, with similarly functioning components in comparison to FIG. 1, may include keypad member 104 having transparent, partially transparent, or opaque (e.g., non-transparent) components including an outer user interface layer that is devoid of screen printed, etched, raised structures, or otherwise viewable key symbols. Instead, this aspect may include a keypad symbol system 120 that is capable of projecting an image 125 of the key symbols onto the otherwise blank surface of keypad member 104. Keypad symbol system 120 may include a motion sensor 122 capable of sensing the motion of approaching entity 112, a symbol projector 124 to project image 125 of the plurality of different key symbols onto the surface of keypad member 104 upon the detection of motion by sensor 122, and a timer 126 to limit a duration of symbol projector 124 projecting the image of the plurality of different key symbols. For instance, timer 126 may be activated upon an initial projection of the image 125 by symbol projector 124, and operates to time a time duration of the projection and turn off symbol projector 124 after a preset designated period of time elapses. Keypad symbol system 120 may be mounted on any structure or surface that allows for projecting image 125 onto the face of the keypad member 104, such as in/on a ceiling or wall adjacent to the keypad member 104.

Figure 3:
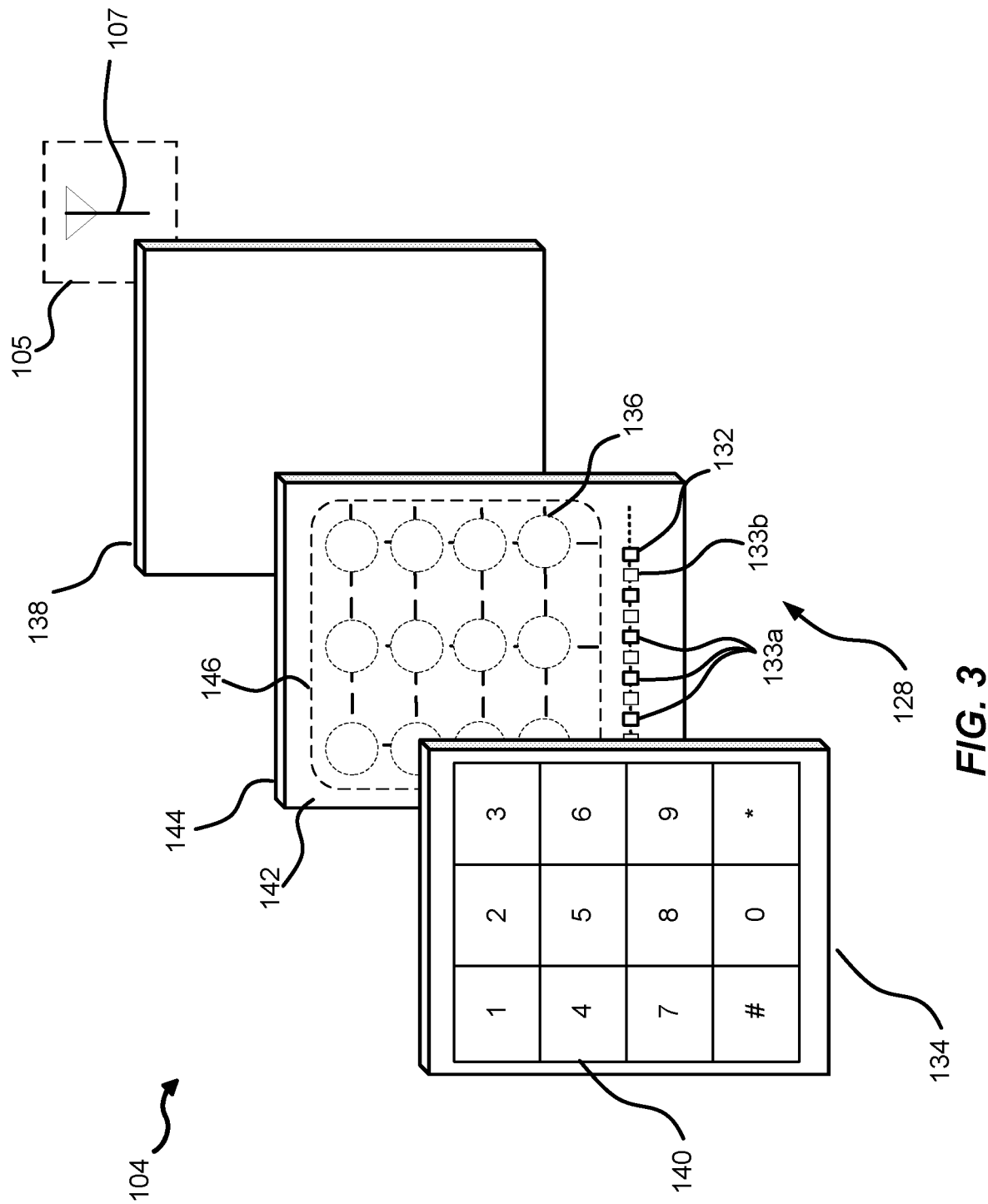
FIG. 3 is an exploded perspective view of an example of an inconspicuous keypad member, according to the described aspects of the present disclosure.

Referring to FIG. 3, an example keypad member 104 may comprise a plurality of different layers that work in concert to receive user input 110 from entity 112, while also inconspicuously blending in to the surrounding environment by being substantially translucent or by matching a color of a surface to which keypad member 104 is mounted. The plurality of different layers of inconspicuous keypad member 104 may include a substantially translucent capacitive sensing layer 128 disposed below a substantially translucent user interface layer 134, both of which may be mounted on a substantially transparent substrate layer 138. User interface layer 134 may include an outer surface having a plurality of different symbols 140 formed or printed thereon in different respective areas. User interface layer 134 may be a thin layer of substantially transparent plastic, rubber, an elastomeric material, or any other material onto which plurality of symbols 140 may be visible, and/or any material that does not inhibit an ability of capacitive sensing layer 128 to detect capacitance coupling with an object (e.g., a finger of entity 112) adjacent to the outer surface of user interface layer 134. Capacitive sensing layer 128 may include a keypad circuit 146 having a plurality of capacitive sensors 136 formed in different areas corresponding to areas of a plurality of symbols 140 that are screen printed, etched, formed on, or otherwise illustrated on the user interface layer 134. In an implementation, key pad circuit 146 and plurality of capacitive sensors 136 may be comprised of an electrically conductive material, such as but not limited to copper or a transparent conductive ink. Capacitive sensing layer 128 may be a thin layer of substantially transparent plastic, rubber, an elastomeric material, or any other material to which the plurality of capacitive sensors 136 may be mounted. The plurality of capacitive sensors 136 may be capable of receiving user input 110 via entity 112 interfacing with the plurality of capacitive sensors 136, wherein the capacitive sensors 136 may comprise contact sensors or non-contact sensors. User input 110 may comprise a specific sequence or combination of signals from the plurality of capacitive sensors 136, each of these signals corresponding with one of the plurality of symbols 140 that may comprise any combination of numeric symbols, alphanumeric symbols, alphabetic symbols, or otherwise. For example, in FIG. 3, in one example, the plurality of symbols 140 includes an arrangement of twelve symbol members includes numbers 0-9, and pound and star symbols. In an implementation, only the correct sequence or combination of symbols, and thus signals, identify entity 112 as authorized for entry to restricted space 102, as any other combination or sequence results in denied access. As previously articulated, the plurality of symbols 140 may be screen printed, etched, or otherwise illustrated upon user interface layer 134, in order to inform entity 112 of the location of the different input symbols. Additionally, substrate layer 138 may be an optional layer configured to form a base to which user interface layer 134 and capacitive sensing layer 128 may be mounted. For example, substantially transparent adhesive or other joining materials may be used between the layers to affix together the layers. In an aspect, substrate layer 138 may also include a substantially transparent adhesive or other joining material on a back, outer surface to enable substrate layer 138 to be fixed to a mounting surface, such as a wall, a door, etc. Substrate layer 138 may be a thin layer of substantially transparent plastic, rubber, an elastomeric material, or any other material configured to support user interface layer 134 and capacitive sensing layer 128. Keypad member 104 may further include an access reader 105 and/or antenna 107 embedded therein for reading or communicating with an access device or access devices. In one example, the access reader 105 may include antenna 107 therein and may be embedded within a layer of keypad member 104. In another example, the antenna 107 may be embedded within keypad 104 and the access reader 104 may be mounted or located in a remote location from antenna 107, which may further improve the discrete integration of keypad member 104 within the surrounding environment. In another example, the antenna 107 and/or access reader 105 may be mounted in proximity to or near the keypad 104 and may for example be embedded in a wall or door. The aforementioned access device may for example include any one or combination of a radio-frequency identification (RFID) device or other near field communication device, some example of which may include an access card, fob, decal, or badge, to name a few examples. The antenna 107 may for example provide an interrogation signal and/or energize the access device and receive an authentication reply from the access device. In another example, the antenna 107 may receive and/or transmit signals to a Bluetooth device and/or a cellular device. Detection of an authorized access device via antenna 107 may identify entity 112 as authorized for entry to restricted space 102 either in lieu of the aforementioned correct sequence or combination of symbols and/or in combination with the aforementioned correct sequence or combination of symbols. In another example, the correct sequence or combination of symbols may be determined based on the identified access device. For example, when a first access device is detected via antenna 107, a first sequence of combination of symbols is required to identify entity 112 as authorized for entry into restricted space 102, when a second access device is detected, a second sequence or combination of symbols is required to identify entity 112 as authorized for entry in to restricted space 102.

According to some aspects, keypad member 104 also may include an access indicator device 192, wherein access indicator device 192 may be configured to generate the access status indicator having a first characteristic in response to receiving the unlock signal or having a second characteristic in response to receiving the access denied signal, wherein the first characteristic and the second characteristic comprise at least one of the audibly-different, visibly-different, or haptically-different outputs. For example, access indicator device 192 may include a plurality of light elements 132, such as micro light emitting diodes (LEDs), embedded within capacitive sensing layer 128, in order to communicate a result of the access determination message 114 to entity 112 upon review by global access control system 108. In an implementation, for example, light elements 132 may include at least two distinct color LED members, such as at least one first color member 133a having a green color and at least one second color member 133b having a red color, each which communicate the value specified in the access determination message 114 via visibly-different outputs. For example, if access determination message 114 includes an access authorized value, a signal received by keypad member 104 may trigger a current to pass through the first color member 133a, thereby generating a green light indicating to entity 112 that the access request 172 was authorized. Conversely, if the access determination message 114 includes an access denied value or otherwise, a signal received by keypad member 104 may trigger a current to pass through the second color member 133b, generating a red light communicating to entity 112 that access request 172 was denied. It should be understood that light elements 132 may include any other number of color members to indicate other states of access, such as but not limited to at least one third color member having an amber color to indicate an error in the access entry process. Further, access indicator device 192 may be configured to blink in different patterns, output different symbols, or otherwise communicate the result of the access determination message.

Additionally, according to various aspects of the present disclosure, inconspicuous keypad member 104 may be configured to blend in with the surrounding environment by being formed from a plurality of substantially translucent layers. For example, substrate layer 138, capacitive sensing layer 128, and user interface layer 134 may be formed from a translucent plastic or acrylic and mounted together such that keypad member 104 may be almost entirely translucent. Although an almost entirely translucent keypad member 104 may inconspicuously integrate into the surrounding environment successfully, there may exist some environments where a mostly translucent keypad member 104 would not be sufficiently inconspicuous. Consequently, in some implementations, one or more of substrate layer 138, capacitive sensing layer 128, and/or user interface layer 134 of keypad member 104 may be formed from an opaque plastic, opaque acrylic or other material, where a color of the keypad member 104 may visually match the mounting surface, enabling the discrete integration of keypad member 104 within the surrounding environment.

Figure 4:
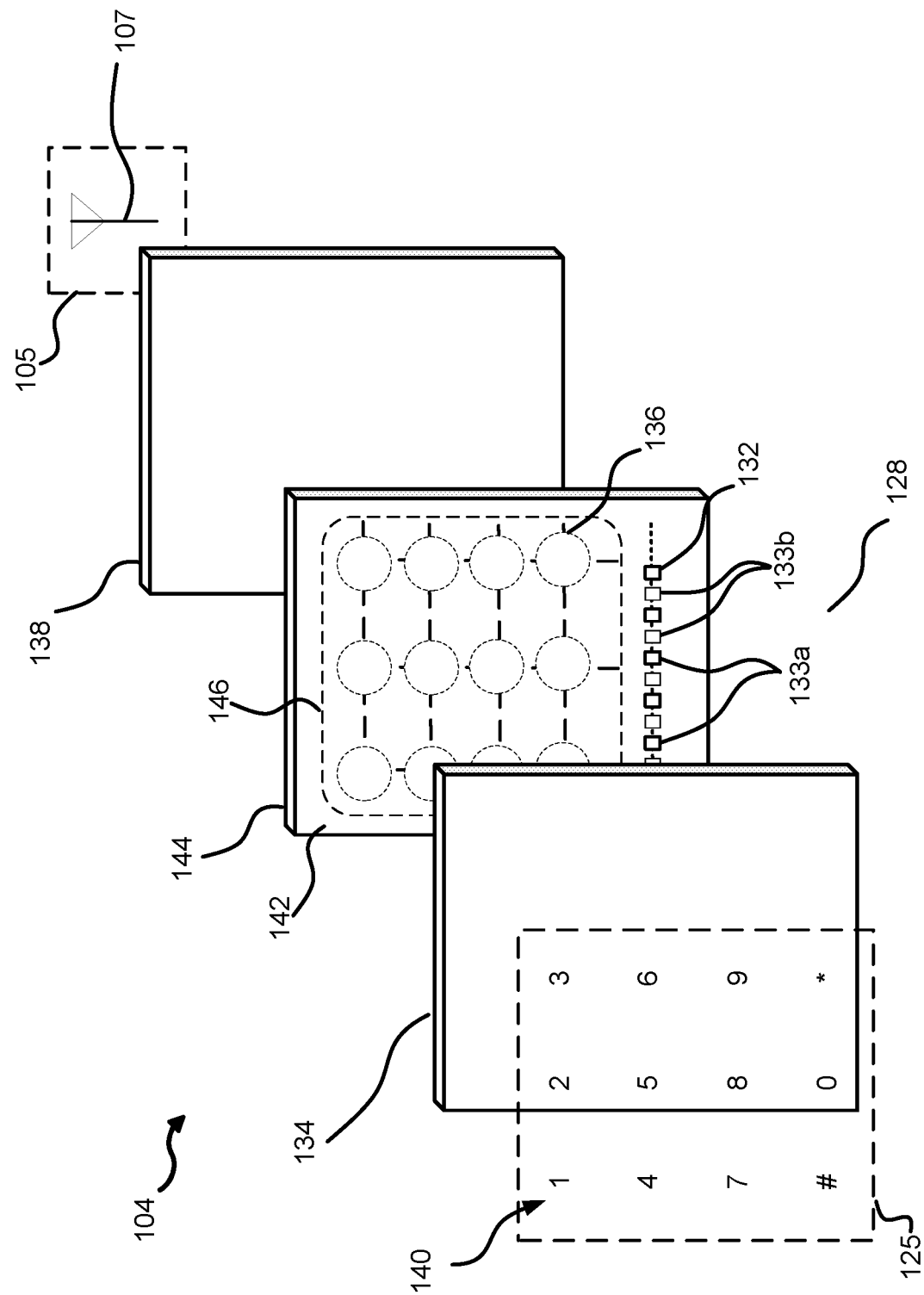
FIG. 4 is an exploded perspective view of another example of an inconspicuous keypad member, according to the described aspects of the present disclosure

Referring to FIG. 4, another example of keypad member 104, which corresponds with the other example of access control system 100 in FIG. 2, includes the plurality of symbols 140 being projected in image 125 from keypad symbol system 120 onto user interface layer 134 when motion is sensed by motion sensor 122 in the general vicinity of keypad member 104. In this example, the time limited projection of image 125 of the plurality of symbols 140 may further disguise the purpose or function of the otherwise inconspicuous keypad member 104. Additionally, similar to the example of keypad member 104 in FIG. 3, user interface layer 134, capacitive sensing layer 128, and substrate layer 138 of the example in FIG. 4 may also be formed by a transparent, translucent, or opaque material in order to match or inconspicuously fit in with the surrounding environment.

Figure 5:
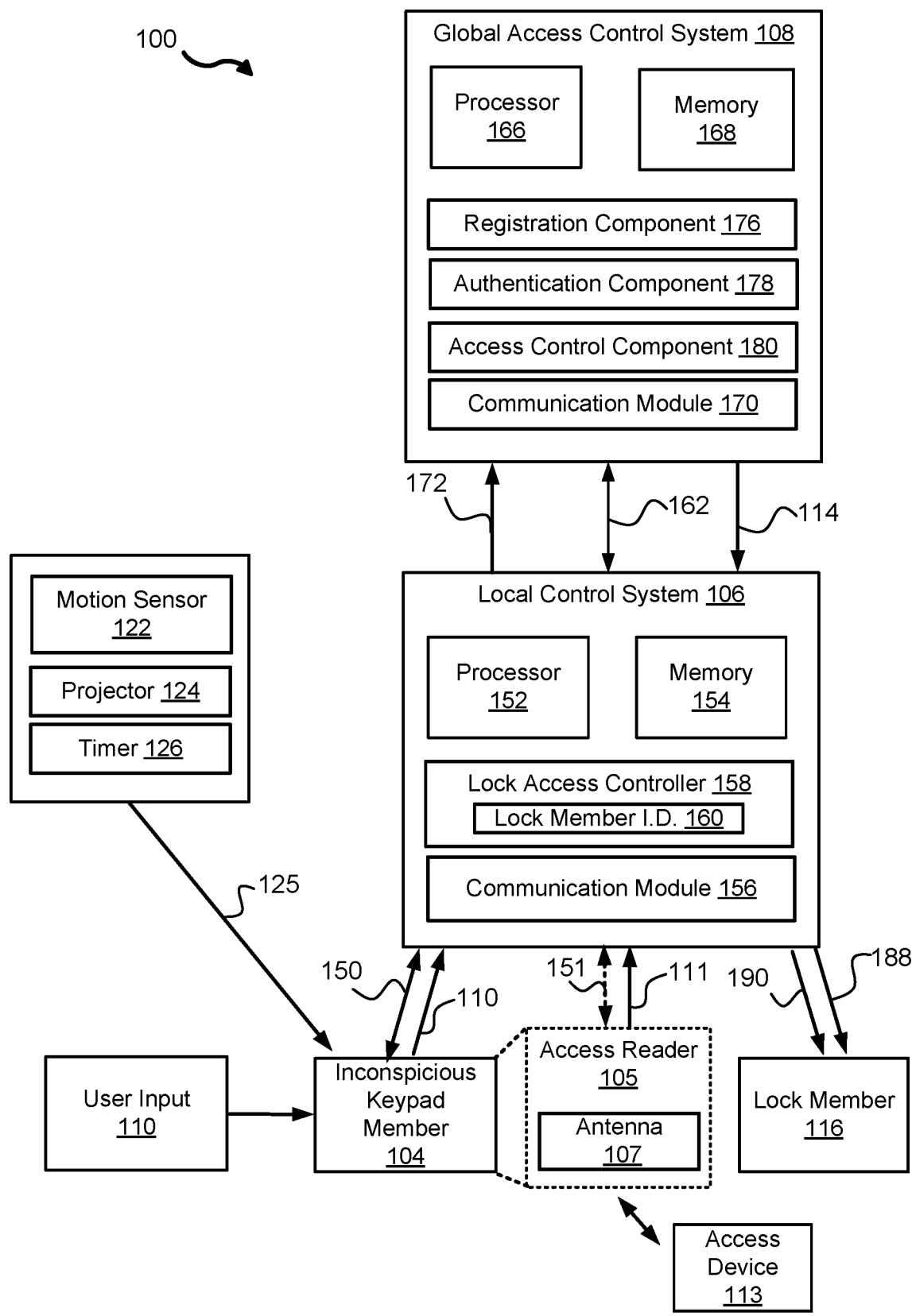
FIG. 5 is a block diagram of the inconspicuous access control system and its constituent parts, according to the described aspects of the present disclosure.

Referring to FIG. 5, the different components and interactions between those components in inconspicuous access control system 100 are described in more detail. According to aspects of the present disclosure, inconspicuous access control system 100 is configured to receive user input 112, which, as described above in reference to FIG. 3, may comprise a sequence of numeric symbols, alphanumeric symbols, alphabetic symbols or otherwise, which comprise some type of access key and/or user identification key, such as an assigned Personal Identification Number (PIN). User input 110 is received by keypad member 104 based on manual inputs by entity 112 via the contact or non-contact with a sequence of the capacitive sensors 136. Keypad member 104, which may include a communication module component within keypad circuit 146, electrically transmits or transfers user input 110 to the local control system 106 via communication link 150. In addition to or in combination with the aforementioned user input 110, the access control system 100 may further include access reader 105 with antenna 107 for detecting or receiving an input or signal from an access device 113 via antenna 107. The access reader 105 may for example be configured to provide an interrogation signal and/or energize the access device 113 and receive an authentication reply from the access device via antenna 107. In another example, the access reader 105 may receive and/or transmit signals to access device 113 via antenna 107. The access reader 105 may provide signal 111 to the access control system based on access device 113. The access reader 105 may further include communication link 151 with local control system 106. The antenna 107 of access reader 105 may be embedded therein and/or may be mounted or embedded at a remote location. In one example, the antenna 107 and/or access reader 105 may be embedded within the keypad member 104.

Local control system 106 may include a processor 152 and a memory 154 that work in concert to control the functions of local control system 106. Additionally, local control system 106 may include a communication module 156, capable of receiving user input 110 via a keypad member communication link 150, an access reader communication link 151, and a lock access controller 158, which controls the transmission of the unlock signal to lock member 116, which triggers moving lock member 116 from a locked position to an unlocked system. Also, lock access controller 158 may include a lock member identification number 160, such as any value or set of numbers/characters that identifies lock member 116 and/or the specific door or other access restricting mechanism that is controlled by local control system 106. Local control system 106 is further capable of transmitting an access request 172 to global access control system 108 via communication link 164, wherein access request 172 may include user input 110 and lock member identification number 160 of lock member 116 for which access is being requested.

Global access control system 108 may receive access request 172 from local control system 106, as well as other access requests from a plurality of other local control systems, all corresponding to different restricted locations. Consequently, global access control system 108 may be capable of coordinating access control to a variety of locations. For example, global access control system 108 may control access to individual office rooms, entire office floors, and also the entire office building contemporaneously.

According to various aspects, global access control system 108 may include a processor 166 and a memory 168, which operate in conjunction with a communication module 170 to receive access request 172 via communication link 164 and make access determinations. In an implementation, memory 168 may include a database 162 that includes a list of authorized user input 110 and corresponding local lock identification number 160 combinations, to which each received access request may be compared to determine access authorization. Database 162 may be accessed and edited by a system manager or other entity or collection of entities that control individual authorization of entities allowed access to controlled space 102. Global access control system 108 further includes a registration component 176 configured to register authorized combinations of user input 110 and corresponding local lock identification number 160, an authentication component 178 configured to determine whether a received access request includes parameters that match the authorized information, and an access control component 180 configured to transmit an access determination message 114 enabling or denying access based on a result of the authentication check performed by authentication component 178. As such, registration component 176, authentication component 178, and access control component 180 may work in concert to formulate access determination message 114. Access determination message 114 may include an access authorized value 115a or an access denied value 115b to respectively enable or deny access to restricted location 102. Global access control system 108 may be further configured to transmit access determination message 114 via communication module 170 and communication link 164 to local control system 106.

Local control system 106 receives the access determination message 114 via communication module 156 and communication link 164. Lock access controller 158 is configured to transmit lock control signal 190 to lock member 116 via communication link 188 to control unlocking (or, optionally, locking) of lock member 116. For example, if the access determination message 144 includes the access authorized value, then lock control signal 190 is configured to trigger movement of the lock member 116 from a locked position to an unlocked position.

In an optional aspect where user interface layer 134 of keypad member 104 is devoid of any input indicia, system 100 may further include motion sensor 122 to detect motion near keypad member 104, such as by entity 112 approaching, or providing user input 110 to, keypad member 104. Upon detecting such a motion event, motion sensor 122 is configure to trigger projector 124 to project image 125 of the plurality of symbols 140 onto the surface of keypad member 104. As noted, image 125 of the plurality of symbols 140 indicates to entity 112 which regions of keypad member 104 correspond to inputs, and hence with respective ones of capacitive sensors 136, for providing user input 110. In some implementations, upon initiating the projection of image 125, motion sensor 122 and/or projector 124 may initiate timer 124 to count down a predetermined duration or length in time, for example, in seconds or minutes, for projector 124 to project image 125. After the predetermined length of time, timer 124 triggers projector 124 to stop projecting image 125.

In another optional aspect of inconspicuous access control system 100 keypad member 104 may further comprise an electroluminescent layer positioned below the outer surface of the user interface layer 134, wherein the electroluminescent layer includes a plurality of electroluminescent symbols, each of the plurality of electroluminescent symbols may be aligned with one of the plurality of capacitive sensors 136 of capacitive sensing layer 128. Further, upon detecting motion near keypad member 104 or contact or coupling with one of the plurality of capacitive sensors 136, the plurality of electroluminescent symbols may be activated, illuminating the position of the capacitive sensors, by applying an electric field to the keypad member 104, and thus the electroluminescent symbols.

While the foregoing disclosure discusses illustrative aspects and/or embodiments, it should be noted that various changes and modifications could be made herein without departing from the scope of the described aspects and/or embodiments as defined by the appended claims. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. An access control device, comprising:
   a keypad member including:
      a substrate layer having a mounting surface and an internal surface;
      a capacitive sensing layer mounted on the internal surface of the substrate layer and including a keypad circuit having a plurality of capacitive sensors defining a plurality of keys,
   wherein the keypad circuit comprises a clear conductive ink;
      a user interface layer mounted on the capacitive sensing layer;
      a communication module in communication with the capacitive sensing layer and having a mounting structure positioned at a spacing distance from the mounting surface of the substrate layer;
      a communication link electrically connecting the communication module and the capacitive sensing layer;
      an image projector configured to project an image of a plurality of symbols on an outer surface of the user interface layer, wherein each of the plurality of symbols is aligned with one of the plurality of capacitive sensors
      a motion sensor in communication with the image projector and configured to detect motion of an object in an area adjacent to the keypad member and generate a motion signal;
      a timer device in communication with the motion sensor and configured to start a timer having a set time duration in response to the motion signal, and wherein the timer device is configured to transmit a timer expiration signal upon expiration of the set time duration; and
      wherein the image projector is further configured to project the image in response to receiving the motion signal and to cease projection of the image in response to the timer expiration signal.

2. The access control device of claim 1, wherein the user interface layer, the capacitive sensing layer, and the substrate layer are formed from a transparent material.

3. The access control device of claim 1, wherein the user interface layer, the capacitive sensing layer, and the substrate layer are formed from an opaque material.

4. The access control device of claim 1, wherein keypad member is mountable in a first environment located at the spacing distance from a second environment in which the communication module is mountable, wherein the communication module is out of view of the keypad member.

5. The access control device of claim 1, wherein the user interface layer further comprises an outer surface having a plurality of symbols, wherein each of the plurality of symbols is aligned with one of the plurality of capacitive sensors.

6. The access control device of claim 5, wherein the plurality of symbols comprise printed symbols or symbols formed by a portion of the outer surface of the user interface layer.

7. The access control device of claim 1, wherein the keypad member further comprises an electroluminescent layer positioned below an outer surface of the user interface layer, wherein the electroluminescent layer includes a plurality of electroluminescent elements defining a plurality of electroluminescent symbols, wherein each of the plurality of electroluminescent symbols are aligned with one of the plurality of capacitive sensors.

8. The access control device of claim 1, wherein the communication link comprises one or more wires having a length that spans the spacing distance.

9. The access control device of claim 1, further comprising:
   an access indicator device mounted in the keypad member and configured to generate access status indicator, wherein the access status indicator includes at least one of an audible, a visible, or a haptic output.

10. The access control device of claim 1, further comprising:
   a lock member movable between a locked position and an unlocked position;
   a lock access controller in communication with the lock member and the communication module;
   wherein the capacitive sensing layer is configured to receive a user access code input at one or more of the plurality of capacitive sensors and transfer the user access code to the communication module via the communication link;

wherein the lock access controller is further configured to transmit an access request in response to receiving the user access code input and to receive an access determination message in response to the access request, wherein the access determination message includes an access authorized value or an access denied value;

wherein the lock access controller is further configured to transmit an unlock signal to the lock member to trigger movement of the lock member from the locked position to the unlocked position in response to receiving the access determination message including the access authorized value.

11. The access control device of claim 1, further comprising:

a lock access controller in communication with the communication module;

an access indicator device mounted in the keypad member and configured to generate access status indicator, wherein the access status indicator includes at least one of an audible, a visible, or a haptic output;

wherein the capacitive sensing layer is configured to receive a user access code input at one or more of the plurality of capacitive sensors and transfer the user access code to the communication module via the communication link;

wherein the lock access controller is further configured to transmit an access request in response to receiving the user access code input and to receive an access determination message in response to the access request, wherein the access determination message includes an access authorized value or an access denied value;

wherein the lock access controller is further configured to transmit an unlock signal to the access indicator device in response to receiving the access determination message including the access authorized value, or to transmit an access denied signal to the access indicator device in response to receiving the access determination message including the access denied value; and wherein the access indicator device configured to generate the access status indicator having a first characteristic in response to receiving the unlock signal or having a second characteristic in response to receiving the access denied signal, wherein the first characteristic and the second characteristic comprise at least one of audibly-different, visibly-different, or haptically-different outputs.

12. The access control device of claim 1, wherein the plurality of capacitive sensors comprise contact sensors or non-contact sensors.

13. An access control system, comprising:
a keypad member including:
a substrate layer having a mounting surface and an internal surface;
a capacitive sensing layer mounted on the internal surface of the substrate layer and including a keypad circuit having a plurality of capacitive sensors defining a plurality of keys,
wherein the keypad circuit comprises a clear conductive ink;
a user interface layer mounted on the capacitive sensing layer, wherein the user interface layer comprises a material that is at least translucent;
a first communication module in communication with the capacitive sensing layer and having a mounting structure positioned at a spacing distance from the mounting surface of the substrate layer;
a first communication link electrically connecting the first communication module and the capacitive sensing layer;
a lock member movable between a locked position and an unlocked position;
a lock access controller in communication with the lock member and the communication module;
an access control manager server comprising a memory and a processor configured to generate an access determination message in response to one or more of the plurality of access sensors receiving a user access code input, wherein the access determination message controls a movement of the lock member;
an image projector configured to project an image of a plurality of symbols on an outer surface of the user interface layer, wherein each of the plurality of symbols is aligned with one of the plurality of capacitive sensors
a motion sensor in communication with the image projector and configured to detect motion of an object in an area adjacent to the keypad member and generate a motion signal;
a timer device in communication with the motion sensor and configured to start a timer having a set time duration in response to the motion signal, and wherein the timer device is configured to transmit a timer expiration signal upon expiration of the set time duration; and
wherein the image projector is further configured to project the image in response to receiving the motion signal and to cease projection of the image in response to the timer expiration signal.

14. The access control system of claim 13, wherein the user interface layer, the capacitive sensing layer, and the substrate layer are formed from a transparent material.

15. The access control system of claim 13, wherein the user interface layer, the capacitive sensing layer, and the substrate layer are formed from an opaque material.

16. The access control system of claim 13, wherein keypad member is mountable in a first environment located at the spacing distance from a second environment in which the communication module is mountable, wherein the communication module is out of view of the keypad member.

17. The access control system of claim 13, wherein the user interface layer further comprises an outer surface having a plurality of symbols, wherein each of the plurality of symbols is aligned with one of the plurality of capacitive sensors.

18. The access control system of claim 17, wherein the plurality of symbols comprise printed symbols or symbols formed by a portion of the outer surface of the user interface layer.

19. The access control system of claim 13, wherein the keypad member further comprises an electroluminescent layer positioned below an outer surface of the user interface layer, wherein the electroluminescent layer includes a plurality of electroluminescent elements defining a plurality of electroluminescent symbols, wherein each of the plurality of electroluminescent symbols are aligned with one of the plurality of capacitive sensors.

20. The access control system of claim 13, wherein the communication link comprises one or more wires having a length that spans the spacing distance.

21. The access control system of claim 13, further comprising:

wherein the capacitive sensing layer is configured to receive the user access code and transfer the user access code to the first communication module via the first communication link;

wherein the lock access controller is further configured to transmit an access request in response to receiving the user access code input and to receive the access determination message in response to the access request, wherein the access determination message includes an access authorized value or an access denied value;

wherein the lock access controller is further configured to transmit an unlock signal to the lock member to trigger movement of the lock member from the locked position to the unlocked position in response to receiving the access determination message including the access authorized value.

22. The access control system of claim 13, further comprising:

an access indicator device mounted in the keypad member and configured to generate access status indicator, wherein the access status indicator includes at least one of an audible, a visible, or a haptic output;

wherein the capacitive sensing layer is configured to receive the user access code and transfer the user access code to the first communication module via the first communication link;

wherein the lock access controller is further configured to transmit an access request in response to receiving the user access code input and to receive the access determination message in response to the access request, wherein the access determination message includes an access authorized value or an access denied value;

wherein the lock access controller is further configured to transmit an unlock signal to the access indicator device in response to receiving the access determination message including the access authorized value, or to transmit an access denied signal to the access indicator device in response to receiving the access determination message including the access denied value; and wherein the access indicator device configured to generate the access status indicator having a first characteristic in response to receiving the unlock signal or having a second characteristic in response to receiving the access denied signal, wherein the first characteristic and the second characteristic comprise at least one of audibly-different, visibly-different, or haptically-different outputs.

23. The access control system of claim 13, wherein the plurality of capacitive sensors comprise contact sensors or non-contact sensors.

\* \* \* \* \*